(12) United States Patent
Kup

(10) Patent No.: US 8,633,750 B2
(45) Date of Patent: Jan. 21, 2014

(54) DELAY CONTROL CIRCUIT AND METHOD

(75) Inventor: Bernardus M. Kup, Eindhoven (NL)

(73) Assignee: NXP B.V., Eindhoven (NL)

( * ) Notice: Subject to any disclaimer, the term of this patent is extended or adjusted under 35 U.S.C. 154(b) by 1409 days.

(21) Appl. No.: 11/575,306

(22) PCT Filed: Sep. 5, 2005

(86) PCT No.: PCT/IB2005/052894
§ 371 (c)(1),
(2), (4) Date: Oct. 5, 2010

(87) PCT Pub. No.: WO2006/030343
PCT Pub. Date: Mar. 23, 2006

(65) Prior Publication Data
US 2011/0068844 A1    Mar. 24, 2011

(30) Foreign Application Priority Data

Sep. 14, 2004    (EP) .................................... 04104425

(51) Int. Cl.
*H03L 7/00* (2006.01)
(52) U.S. Cl.
USPC ......................................................... 327/161
(58) Field of Classification Search
None
See application file for complete search history.

(56) References Cited

U.S. PATENT DOCUMENTS

| 4,700,347 A | 10/1987 | Rettberg et al. |
| 4,841,551 A | 6/1989 | Avaneas |
| 5,022,056 A * | 6/1991 | Henderson et al. ........... 375/373 |
| 5,686,850 A | 11/1997 | Takaki et al. |
| 6,104,228 A | 8/2000 | Lakshmikumar |
| 6,342,797 B1 | 1/2002 | Lee |
| 6,690,201 B1 | 2/2004 | Simkins et al. |
| 2001/0024135 A1 | 9/2001 | Harrison |
| 2002/0040996 A1 | 4/2002 | Magnee et al. |

FOREIGN PATENT DOCUMENTS

| EP | 0424741 A | 5/1991 |
| WO | WO9835446 | 8/1998 |

OTHER PUBLICATIONS

Maneatis: "Low Jitter Process Independent DLL and PLL Based on Self-Biased Techniques"; IEEE Journal of Solid-State Circuits 31 (11): 1723-1732; Nov. 1996.
"JEDEC Standard—DDR2 SDRAM Specification", JEDEC, 80 pgs, retrieved from the internet at: wenku.baidu.com/view/63cff20f844769eae009ed25.html (Sep. 2003).

* cited by examiner

*Primary Examiner* — Daniel Rojas

(57) ABSTRACT

The present invention relates to a delay control circuit and a method of controlling delay of an output signal generating based on an input signal, wherein a plurality of delayed replicas of a reference signal are generated with dedicated time delays with respect to the reference signal and are sampled at a predetermined timing defined by the input signal. One of the delayed replicas is selected based on the output of the sampling means, and the output signal is generated based on the selected replica. Thereby, a predetermined phase relationship can be generated even in cases where no strict phase relation is given between data and reference signal.

10 Claims, 3 Drawing Sheets

DELAY CONTROL CIRCUIT AND METHOD

The present invention relates to a delay control circuit for generating, based on a reference signal, a delayed version of an input signal at a predetermined delay, and to a method of controlling the delay of an output signal, such as a strobe pulse.

Clock signals are used by a wide variety of digital circuits to control the timing of various events occurring during the operation of the digital circuits. For example, clock signals are used to designate when commands and other signals used in computer systems are valid and can thus be used to control the operation of the computer system. A clock signal can then be used to latch the command or other signals so that they can be used after the command or other signals are no longer valid.

Many high-speed integrated devices, such as synchronous dynamic random access memories (SDRAM), rely upon clock signals to control the flow of commands, data and addresses into, through, and out of the devices. Typically, operations are initiated at edges of the clock signals, i.e. transitions from high to low or low to high logical states. In order to control the timing of operations more precisely within the device, each period of a clock signal is sometimes divided into subperiods so that such operations do not begin until shortly after the clock edge.

One method for controlling the timing of operations within a period of a clock signal generates phase-delayed versions of the clock signal. For example, to divide the clock period into four subperiods, phase-delayed versions are produced that lag the clock signal by 90°, 180° and 270°, respectively. Edges of the phase-delayed clock signals provide signal transitions at the beginning or end of each subperiod that can be used to initiate operations. One possible approach to producing such variable delay control clocks employs a delay-locked loop (DLL) driven by a reference clock. The reference clock signal is input to a conventional multiple output variable delay circuit such as described for example in "Low Jitter Process Independent DLL and PLL Based on Self-Biased Techniques", Maneatis, IEEE Journal of Solid-State Circuits 31 (11): 1723-1732, November 1996.

However, there are applications where unlike the reference control clock signal, the reference date clock signal is discontinuous. Typically, the reference date clock signal arrives in bursts of clock pulses as a block of data is accessed. Between bursts, the reference data clock signal is relatively inactive such that the DLL may lose its lock. Consequently, when bursts arrive, the delays of the delayed data clocks may not be properly adjusted by the delay-locked loop and the data may have insufficient or excessive development time at the data bus before latching.

A solution to this problem is proposed by document WO 98/35446, according to which several delayed clock signals are provided, each delayed by a respective time delay relative to a continuous reference clock signal. A selector switch, under control of a logic control circuit, couples one of the delayed clock signals to control data latches. The logic circuit selects a predetermined switch position to select one of the delayed clock signals that has a pulse delayed by approximately half of the clock period relative to the input control clock as the delayed clock signal. The logic control circuit is able to vary the switch position to accommodate changes in clock period that may occur as a result of operative frequency changes. Preferably, the selector switch position is programmed into the logic control circuit when the memory device is produced. However, where the memory device may be used at more than one frequency or where the arrival times of data or commands may vary relative to their respective reference clocks, the memory controller may command the logic control circuit to define a revised selection switch position. The use of the multi-tap variable delay line in combination with the selector switch allows the memory device to be tuned for varying operating conditions of frequencies.

A similar requirement for a digital pulse signal to be delayed over a given fraction of a reference clock period is also valid for the data read portion of a double data rate (DDR) memory interface circuit. In such a DDR interface circuit, the data (DQ) is synchronous to a clock signal (CK). However, the data has no strict phase relation to this clock. Due to this, the exact timing position of the data transitions is instead indicated or signified by a so-called strobe pulse (DQS).

FIG. 1 shows a signalling diagram indicating waveforms of the above signals in the case of a DDR interface read timing. The clock (CK) is continuously available, but the strobe signal (DQS) only has valid edges if valid data (DQ) bits are sent. To obtain maximum reliable data reception it is necessary to sample the data precisely in the center of the data period. The strobe signal must therefore be delayed by an amount of time equal to a quarter) (90° of the clock period.

The above solution proposed by the prior art requires a complex control circuit and tuning operation for adapting a reference clock to varying input frequencies and timings.

It is therefore an object of the present invention to provide a delay control circuit and method, by means of which a precise sampling of the data can be achieved in the absence of a strict phase relation between the clock signal and the strobe signal.

This object is achieved by a delay control circuit as claimed in claim 1 and by a delay control method as claimed in claim 9.

Accordingly, the delayed replicas generated by the signal generating means are sampled at a predetermined timing defined by the input signal, wherein one of the replicas is selected based on the sampling result and the delayed version of the input signal or the delayed output signal is generated based on the selected replica. Thereby, even in cases of substantial phase shifts between the input signal and the reference signal, a fast and reliable generation of an output signal at a correct phase relationship or delay can be generated to obtain maximum reliable data reception. Contrary to the above prior art, the delay control is not based on the sampling result of received data by using a default one of the replica signals and then tuning in response to the sampling result. Rather, the correct one of the replica signals is directly determined by sampling the replicas themselves based on the timing of the input signal, e.g. data strobe signal. This leads to a faster and less complex synchronisation process.

The sampling means may comprise coding means for generating a selection signal based on the output of the sampling means, wherein the selection signal is used to select one of the replicas. The use of the coding means provides the advantage that an input terminal can be provided for inputting a delay information indicating a desired delay of the delayed version, wherein the coding means can be adapted to generate the selection signal based on a combined consideration of the output of the sampling means and the delay information. Thereby, an output signal can be generated at any desired delay with respect to the reference signal.

Furthermore, the coding means may comprise a plurality of logic gates arranged for receiving at their two input terminals respective data of sampled replicas with successive values of dedicated time delays, wherein the logic gates may be adapted to generate an active output signal if different logic values are applied at their input terminals. Using the logic gates provides a simple solution for implementing the coding means, especially if no specific delay information is required.

The selecting means may comprise a plurality of switching means each receiving a respective one of the delayed replicas and being controlled by an output signal of a respective one of the logic gates. This measure serves to further simplify the control circuitry by simply using the output signals of the logic gates to control the switching operation for switching one of the delayed replicas to the output of the control circuit.

Additionally, the sampling means may comprise a plurality of flip flop means for sampling the state of the delayed replicas in response to the predetermined timing of the input signal applied at their clock inputs. This leads to a simple solution, as the input signal can just be supplied to a clock input of the flip flop means to thereby sample the delayed replicas based on the characteristic of the clock input, e.g., positive or negative edge-controlled clock input. The predetermined timing may thus correspond to at least one of a rising edge and a falling edge of the input signal.

In the specific implementation according to the preferred embodiment, the input signal may be an intermittent strobe signal and the reference signal may be a continuous clock signal.

The present invention will now be described based on a preferred embodiment with reference to the accompanying drawings in which.

Figure 1:
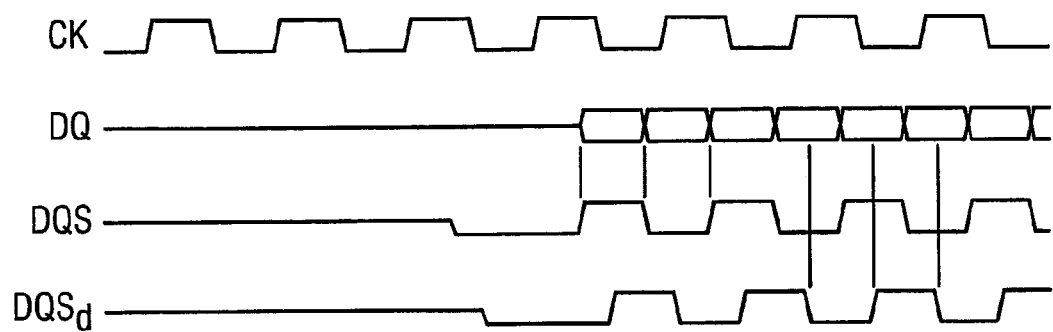
FIG. 1 shows a signaling diagram indicating waveforms of characteristic signals of a delay control circuit.

The preferred embodiment will now be described on the basis of a digital pulse delay circuit (DPDC) for use in a data read portion of a DDR memory interface circuit, wherein the data (DQ) is synchronous to a clock signal CK but has no strict phase relation to this clock as shown in FIG. 1. The exact timing position of the data transitions is indicated by the strobe pulse (DQS).

Figure 2:
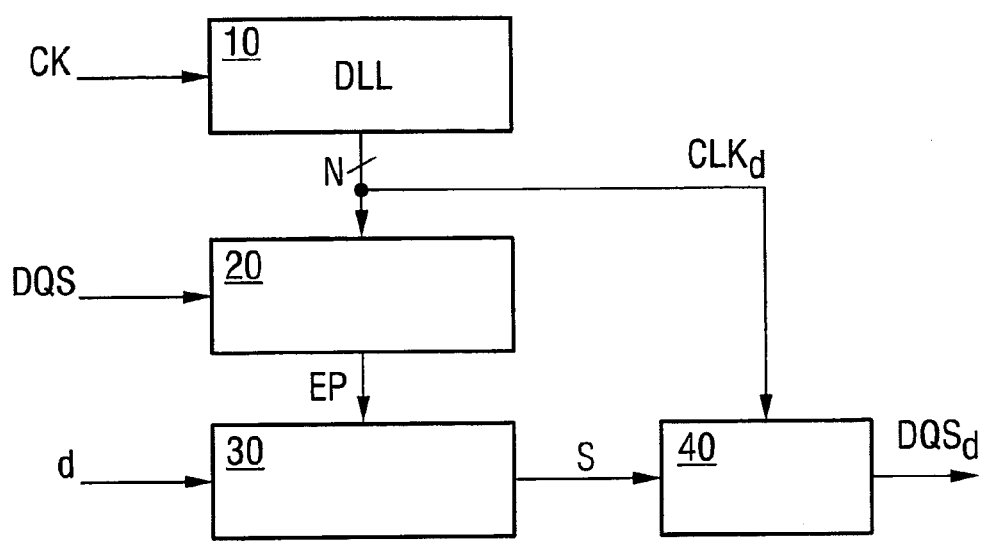
FIG. 2 shows a schematic block diagram of the delay control circuit according to the preferred embodiment.

FIG. 2 shows a schematic block diagram of the proposed DPDC according to the preferred embodiment. This delay control circuit can delay an incoming pulse by a fraction of the reference clock period. Although described here in the context of a DDR interface, its application is not restricted to this, and many other applications requiring an output signal at a predetermined or programmable delay are conceivable.

In the DPDC shown in FIG. 2, a delay locked loop (DLL) 10 locks to the incoming reference clock CK and produces a number N of time-delayed replicas or copies of this reference clock CK. The time-delayed replicas are supplied to a pulse sampling circuit 20 which samples the position of at least one edge of an incoming strobe signal DQS applied to a respective input of the pulse sampling circuit 20, by using these clock replicas. The edge position or other timing information obtained from the sampling process is supplied to a decoder or an encoder circuit 30, where it may be combined with an optional delay information indicating a desired delay value, to produce a select signal S which controls a selector circuit 40 so as to supply a delayed clock replica $CLK_d$ selected from the N delayed clock replicas to the circuit output as a delayed version of the input pulse or strobe signal DQS. Depending on the chosen resolution of the DLL circuit 10, an arbitrary precision of the delay can be obtained.

Moreover, depending on the implemented complexity of the pulse sampling circuit 20, the decoder/encoder 30 and the selector circuit 40, the proposed DPDC can be arranged to act on risings edges, falling edges or both edges of the incoming strobe signal DQS.

Figure 3:
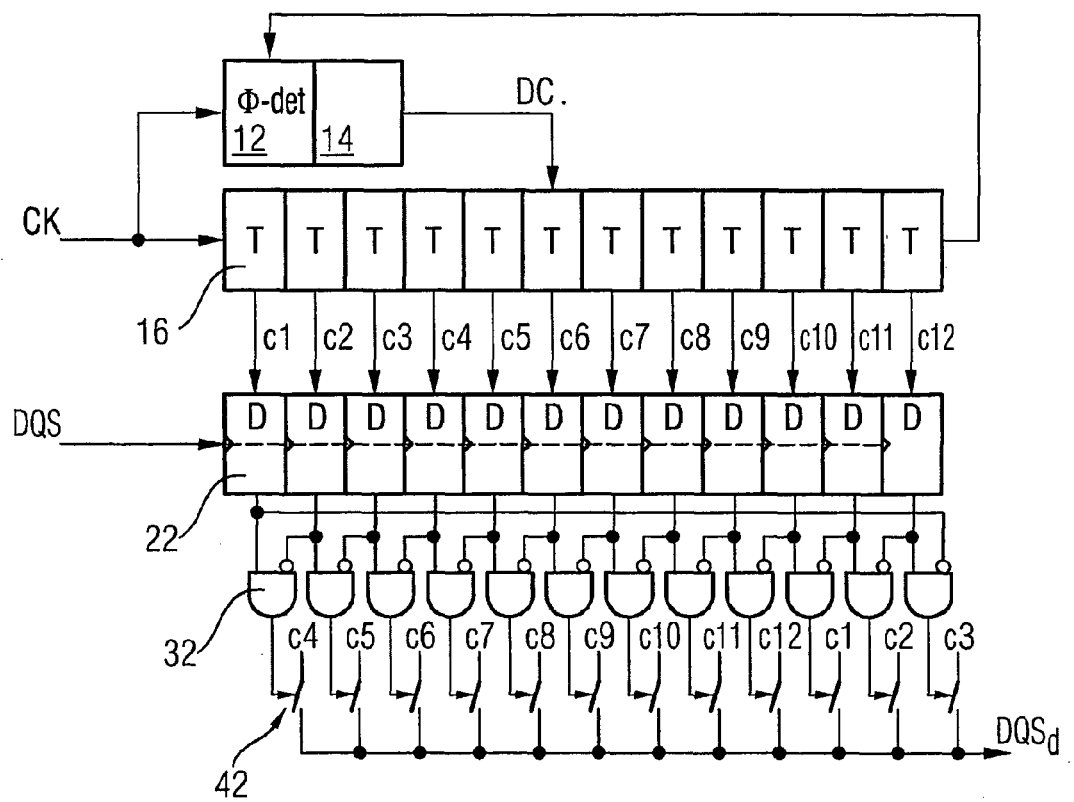
FIG. 3 shows a schematic circuit diagram of an implementation example of the delay control circuit according to the preferred embodiment.

FIG. 3 shows a schematic circuit diagram of a specific implementation example of the DPDC. This implementation example corresponds to a simple but usable solution for the kind of pulse delay needed to implement a DDR interface circuit.

According to FIG. 3, the DLL circuit 10 of FIG. 1 comprises a phase detection circuit 12 followed by a loop filter 14 used for suppressing unwanted signal components. Furthermore, the DLL circuit 10 comprises a chain of controlled delay elements 16 each having a specific delay T, so that the total delay of the DLL circuit 10 amounts to 12 T. In the present implementation example, a resolution of the DLL circuit is shown as 12 taps (12 T), to thereby reduce complexity of the schematic circuitry. However, the delay circuit can be implemented by any other number of taps, i.e. delay elements, depending on the desired resolution.

In the circuit of FIG. 3, the parallel output signals of the delay elements 16 provide a plurality of replicas of the reference clock signal CK at successively increasing delays, wherein neighbouring or adjacent replicas have a time difference and thus delay difference of one tap. In comparison to the reference clock signal CK, the last delayed replica c12 is delayed by 12 taps (12 T). The total delay of 12 T is controlled by the phase detector 12 and the loop filter 14 to equal the incoming clock period. This is achieved by supplying a feedback signal DC (Delay Control), derived from the output of the last delay element to an input of the phase detector 12.

The sampling circuit 20 of FIG. 2 is implemented by a row of D-type flip flops (D-FF) 22 which sample the state of the delayed replicas at the output of the DLL circuit. In the present example, sampling is performed at the rising edge of the incoming pulse or strobe signal DQS. The sampling operation is achieved by supplying the input strobe signal DQS to the clock input of all D-FFs 22. The logical output values of the D-FFs 22 are supplied to a decoder circuit implemented by a plurality of logic AND-gates having a non-inverted input and an inverted input so as to generate an active output signal if a logic state at the non-inverted input corresponds to an active state or logical value "1", and the logic state at the inverted input corresponds to a non-active state or logical value "0". Thereby, a simple decoder function is achieved which output translates a rising edge position to a "one-hot" code, i.e. one of the logic AND-gates 32, which has different logical states at its respective input terminals, generates an active output signal, while the other logic AND-gates 32 generate an inactive output signal.

The parallel output values of the logic AND-gates 32 can be interpreted as a code word with one active bit, based on which a row of switches 42 is controlled to select one of the delayed replicas at the outputs of the DLL circuit 10, i.e. the delay chain, and make this signal available as the delayed strobe signal $DQS_d$ at the output of the delay control circuit.

In the present implementation example shown in FIG. 3, the delay is fixedly wired and is not made selectable e.g. based on input option for inputting the delay information d. Due to the implemented fixed choice of DLL tap numbers as selector inputs, the rising edge of the input strobe signal DQS is shifted over a fixed fraction of the clock period, i.e. 3/12=90 degree in the present example. This is achieved by selecting an allocation between the switches 42 and the respective output terminals of the DLL circuit 10, so that the output terminals are shifted by three positions to the left in the example of FIG. 3. Therefore, regardless of the logic AND-gate which outputs the active signal, the delayed output strobe signal $DQS_d$ will be delayed by the fixed fraction of 3 T which corresponds to 90 degree. Of course, any other fixed delay can be implemented by changing the allocation between the switches 42 at the output of the AND-gates 32 and the outputs of the DLL circuit 10. A programmable delay based on the input delay information d can be implemented by providing a logic or shift circuitry between the output of the DLL circuit 10 and the input of the switches 42.

In the simple implementation example of FIG. 3, only the rising edge of the incoming strobe signal DQS is sensed and the period length of the strobe signal DQS is replaced by the period length of the clock signal CK. However, this is not a requirement, and it is also possible to separately sample and decode rising and falling edges of the strobe signal DQS and to reproduce these edges a given time delay later at the output of the delay control circuit.

Furthermore, in the implementation example of FIG. 3, the delay time is determined by the fixed choice of tap offset at the selector circuit 20. However, this can be modified by providing a selectable delay or by a more complex decoder implementation, as already mentioned above.

In case the input strobe signal DQS is of a slow or noisy quality, this may lead to double or multiple edge detections, close after each other, which may cause erroneous recovery of data. In the implementation of FIG. 3, the delayed output strobe signal $DQS_d$ is always timed relative to the latest occurrence of an edge of the input strobe signal DQS, provided that the distance between these double edges is less than the delay which has been; realised.

Once the input strobe signal DQS has triggered the circuit, the delayed output strobe signal $DQS_d$ is a continuous rather than a burst type signal. This is the case even if the input strobe signal DQS is a discontinuous signal. This may be an advantage in view of the fact that a reference timing position for sampling the data is to be generated rather than an indication of the presence of this data.

In many applications, the position of the input strobe signal DQS with respect to the system clock CK is of a stable (but unknown) nature. In such cases, the system can be extended by adding a temporal filtering in the path at the location of the edge position EP or the select signal S, to improve the quality of the select signal S. This additional filter can have time averaging or median filtering properties.

In summary, a delay control circuit and a method of controlling delay of an output signal generating based on an input signal has been described, wherein a plurality of delayed replicas of a reference signal are generated with dedicated time delays with respect to the reference signal and are sampled at a predetermined timing defined by the input signal. One of the delayed replicas is selected based on the output of the sampling means, and the output signal is generated based on the selected replica. Thereby, a predetermined phase relationship can be generated even in cases where no strict phase relation is given between data and reference signal.

It is noted that the present invention is not restricted to the above preferred embodiment but can be used in any delay control circuit to obtain an output signal with a predetermined delay. The circuit components and blocks of the preferred embodiment may be implemented by concrete hardware circuits or by software routines controlling a processor device, such as a digital signal processor. The preferred embodiments may thus vary within the scope of the attached claims.

It must further be noted that the term "comprising" when used in the specification including the claims is intended to specify the presence of stated features, means, steps or components, but does not exclude the presence or addition of one or more other features, means, steps or components or groups thereof. Furthermore, the word "a" or "an" preceding an element in a claim does not exclude the presence of a plurality of such elements. Moreover, any reference sign does not limit the scope of the claims.

The invention claimed is:

1. A delay control circuit for generating, based on a reference signal, a delayed version of an input signal at a predetermined delay, said delay control circuit comprising:
   a. signal generating means for producing a plurality of delayed replicas of said reference signal, each of said delayed replicas having respective dedicated time delays with respect to said reference signal;
   b. sampling means for sampling said delayed replicas at a predetermined timing defined by said input signal; and
   c. selecting means for selecting one of said replicas based on the output of said sampling means and for generating said delayed version based on said selected replica.

2. A circuit according to claim 1, wherein said selecting means comprises coding means for generating a selection signal based on said output of said sampling means, wherein said selection signal is used to select said one of said replicas.

3. A circuit according to claim 2, wherein said coding means comprises an input terminal for inputting a delay information indicating a desired delay of said delayed version, and wherein said coding means is adapted to generate said selection signal based on a combined consideration of said output of said sampling means and said delay information.

4. A circuit according to claim 2, wherein said codings means comprises a plurality of logic gates receiving at their two inputs terminals respective data of sampled replicas with successive values of said dedicated time delays, and wherein said logic gates are adapted to generate an active output signal if different logic values are applied at their input terminals.

5. A circuit according to claim 4, wherein said selecting means comprise a plurality of switching means each receiving a respective one of said delayed replicas and being controlled by an output signal of a respective one of said logic gates.

6. A circuit according to claim 1, wherein said sampling means comprises a plurality of flip flop means for sampling the state of said delayed replicas in response to said predetermined timing of said input signal applied at their clock inputs.

7. A circuit according to claim 6, wherein said predetermined timing corresponds to at least one of a rising edge and a falling edge of said input signal.

8. A circuit according to claim 1, wherein said input signal is an intermittend strobe signal and said reference signal is a continuous clock signal.

9. A method of controlling delay of an output signal generating based on an input signal, said method comprising the steps of:
   a. generating a plurality of delayed replicas of a reference signal, each of said delayed replicas having respective dedicated time delays with respect to said reference signal;
   b. sampling said delayed replicas at a predetermined timing defined by said input signal;
   c. selecting one of said replicas based on the output of said sampling means; and
   d. generating said output signal based on said selected replica.

10. A delay control circuit for generating, based on a reference signal, a delayed version of an input signal at a predetermined delay, said delay control circuit comprising:
    signal generating means for producing a plurality of delayed replicas of said reference signal, each of said delayed replicas having respective dedicated time delays with respect to said reference signal;

sampling means for sampling said delayed replicas at a predetermined timing defined by said input signal;

selecting means for selecting one of said replicas based on the output of said sampling means and for generating said delayed version based on said selected replica;

wherein said selecting means comprises coding means for generating a selection signal based on said output of said sampling means, wherein said selection signal is used to select said one of said replicas;

wherein said codings means comprises a plurality of logic gates receiving at their two inputs terminals respective data of sampled replicas with successive values of said dedicated time delays, and wherein said logic gates are adapted to generate an active output signal if different logic values are applied at their input terminals; and wherein said selecting means comprise a plurality of switching means each receiving a respective one of said delayed replicas and being controlled by an output signal of a respective one of said logic gates.

* * * * *